US010437943B2

(12) United States Patent
Chrisp (10) Patent No.: US 10,437,943 B2
(45) Date of Patent: Oct. 8, 2019

(54) METHOD OF AND SYSTEM FOR OPTIMIZING NURBS SURFACES FOR AN IMAGING SYSTEM

(71) Applicant: Massachusetts Institute of Technology, Cambridge, MA (US)

(72) Inventor: Michael Chrisp, Burlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 696 days.

(21) Appl. No.: 15/051,787

(22) Filed: Feb. 24, 2016

(65) Prior Publication Data

US 2017/0242941 A1 Aug. 24, 2017

(51) Int. Cl.
*G06F 17/50* (2006.01)
*G06T 17/30* (2006.01)
*G02C 7/02* (2006.01)

(52) U.S. Cl.
CPC ...... *G06F 17/5009* (2013.01); *G06F 17/5086* (2013.01); *G06T 17/30* (2013.01); *G02C 7/028* (2013.01)

(58) Field of Classification Search
None
See application file for complete search history.

(56) References Cited

U.S. PATENT DOCUMENTS 8,310,481 B2 11/2012 Bailey
2009/0228251 A1 9/2009 Cakmakci et al.

OTHER PUBLICATIONS

Turner, et al. "Optimization using rational Bezier control points and weighting factors," Sep. 11, 2008, Proc. SPIE 7061, Novel Optical Systems Design and Optimization XI, 11 pages.*

(Continued)

*Primary Examiner* — Suzanne Lo
(74) *Attorney, Agent, or Firm* — Iandiorio Teska & Coleman, LLP (57) ABSTRACT

A method of and program for optimizing NURBS optical surfaces for an imaging system. Preferably, the number and location of field point sources to be used in ray tracing of a NURBS modeled imaging system surfaces are determined by automatically iteratively increasing the number of field point sources during ray tracing until the spot size from adjacent field points sources on the image plane of the imaging system varies by less than a predetermined value. The number of rays for each field point source to be used in ray tracing of the NURBS modeled imaging system surfaces is preferably determined by automatically iteratively increasing the number of rays for each field point source during ray tracing until a predetermined number of rays intersect each NURBS rectangular grid sub-area. In ray tracing the modeled NURBS surfaces, the determined number and location of field point sources and the determined number of rays from each field point source are used and the grid control points of each NURBS surface are preferably iteratively adjusted, keeping symmetry or allowing freeform shapes, by means of an optimization algorithm based on ray tracing until spot sizes on the image plane meet a set requirement and/or until improvement in spot size is below a predetermined value.

7 Claims, 11 Drawing Sheets

(56) References Cited

OTHER PUBLICATIONS

Jester et al. "B-spline representation of optical surfaces and its accuracy in a ray trace algorithm", Feb. 20, 2011, Applied Optics, vol. 50, No. 6, pp. 822-828.*
Chrisp, Michael P. "Three Mirror Anastigmat Designed with NURBS Freeform Surfaces" 2013, Renewable Energy and the Environment Congress, 3 pages.*
Chase, Holden. "Optical design with rotationally symmetric NURBS" Dec. 23, 2002, Proc. SPIE 4832, International Optical Design Conference 2002, pp. 10-24.*
Chrisp, Michael P. "New Freeform NURBS Imaging Design Code", 2014, Classical Optics 2014, 2 pages.*
Wei Hou et al. "Construction Method through forward and reverse ray tracing for a design of ultra-wide linear field-of-view off-axis freeform imaging systems" 2015, J. Opt. 17, 10 pages.*
Non-Uniform Rational B-Spline, http://en.wikipedia.org/wiki/Non-uniform_rational_B-spline, Jun. 10, 2015, 14 pages.

\* cited by examiner

METHOD OF AND SYSTEM FOR OPTIMIZING NURBS SURFACES FOR AN IMAGING SYSTEM

GOVERNMENT RIGHTS

This invention was made with U.S. Government support under Contract No. FA8721-05-C-0002 awarded by the U.S. Air Force. The Government has certain rights in the invention.

FIELD OF THE INVENTION

The invention relates primarily to optical design programs.

BACKGROUND OF THE INVENTION

Optical design programs are used to design, model, display, and fabricate imaging systems. Typically, the geometry of the optical surfaces of the imaging system lenses, mirrors, and other components are modeled using polynomial based solutions. See published U.S. Patent Application No. 2009/0228251 incorporated herein by this reference. The resulting resolution of the imaging system, however, may not be sufficient for advanced technologies (e.g., telescopes and the like).

Non-uniform rational basis splines (NURBS) may be used to generate a better mathematical model of a surface. The surface is divided up into rectangular grid sub-areas defined by the grid control points. But, known attempts to optimize NURBS surfaces for optical design programs have not been wholly successful. See also published U.S. Patent Application No. 2009/0228251 and U.S. Pat. No. 8,310,481 both incorporated herein by this reference.

SUMMARY OF THE INVENTION

In one aspect, the invention features NURBS surfaces of an imaging system optimized via an algorithm which sets the number and location of field point sources for ray tracing of the imaging system, an algorithm which insures a predetermined number of rays from each field point source strike each NURBS rectangular grid sub-area, and an algorithm which uses the set number and location of the field point sources and their associated ray grids to optimize the NURBS surface grid control points for enhanced resolution.

The resulting optimized grid control points for each NURBS surface of the imaging system and the position of each NURBS surface can be exported into optical and computer-aided design programs for designing, displaying, modeling, and/or fabricating the imaging system.

Featured is a computerized method of optimizing NURBS surfaces for an imaging system. The method comprises modeling the relevant surfaces of the imaging system as NURBS surfaces, determining the number and location of field point sources to be used in ray tracing of the NURBS modeled imaging system surfaces, and determining the number of rays for each field point source to be used in ray tracing of the NURBS modeled imaging system surfaces. The modeled NURBS surfaces of the imaging system are then optimized by ray tracing the modeled NURBS surfaces of the imaging system using the determined number and location of field point sources and the determined number of rays from each field point source. The grid control points of each NURBS surface are iteratively adjusted to minimize the spot sizes of the resulting ray traces on the image plane and the resulting grid control points for each NURBS surface and the position of each NURBS surface of the imaging system are output.

Preferably, after adjusting the grid control points of each NURBS surface, the resulting ray coordinates from each field point source on the image plane are calculated. Small numerical increments may be automatically made to selected grid points and weights of each of the NURBS surfaces and the geometry and the resulting changes of the ray error displacement coordinates with respect to the image centroids are recorded. Using the calculated ray movements, the change in the selected grid control points and weights of each of the surfaces, and the geometry are calculated to reduce the resulting ray error displacement coordinates from each field point source on the image plane with respect to its corresponding centroid on the image plane. The optimization calculates the resulting change of the NURBS surfaces to minimize the spot sizes. In the method, the grid control points may be adjusted until the spot sizes on the image plane meet a set requirement and/or until an improvement in spot size is below a predetermined value.

Determining the number of field point sources may include iteratively increasing the number of field point sources during ray tracing until the spot size from adjacent field point sources on the image plane of the imaging system varies by less than a predetermined value. Determining the number of rays for each field point source may include iteratively increasing the number of rays for each field point source during ray tracing until a predetermined number of rays intersect each NURBS (e.g., rectangular) grid sub-area.

The method may further include using the resulting grid control points for each NURBS surface and the position of each NURBS surface of the imaging system to design, display, model, and/or fabricate optical surfaces for the imaging system.

One method of optimizing NURBS surfaces for an imaging system features modeling each surface of the imaging system as a NURBS surface, determining the best number and location of field point sources to be used in ray tracing of the NURBS modeled imaging system surfaces by automatically iteratively increasing the number of field point sources during ray tracing until the spot size from adjacent field points sources on the image plane of the imaging system varies by less than a predetermined value and determining the best number of rays for each field point source to be used in ray tracing of the NURBS modeled imaging system surfaces by automatically iteratively increasing the number of rays for each field point source during ray tracing until a predetermined number of rays intersect each NURBS rectangular grid sub-area. The modeled NURBS surfaces of the imaging system are optimized by ray tracing the modeled NURBS surfaces of the imaging system using the selected number and location of field point sources and the selected number of rays from each field point source and iteratively optimizing the grid control point positions and weights of each NURBS surface until spot sizes on the image plane meet a set requirement and/or until improvement in spot size is below a predetermined value.

Also featured is a computer program stored on a computer readable medium and including logic configured to model each surface of the imaging system as a NURBS surface, determine the number and location of field point sources to be used in ray tracing of the NURBS modeled imaging system surfaces, and determine the number of rays for each field point source to be used in ray tracing of the NURBS modeled imaging system surfaces. The program uses the determined number and location of field point sources and the determined number of rays from each field point source in ray tracing the modeled NURBS surfaces of the imaging system. The grid control points of each NURBS surface are adjusted to minimize the spot sizes of the resulting ray traces on the image plane to optimize the modeled NURBS surfaces of the imaging system. The output is the resulting optimized grid control point positions and weights for each NURBS surface and the position of each NURBS surface of the imaging system. The computer program logic may be configured to, after adjusting the grid control points of each NURBS surface, calculate the resulting ray coordinates on the image plane. The computer program logic may be configured to increment selected grid points and weights of each of the NURBS surfaces and the geometry and record the resulting changes of the ray coordinates with respect to the image centroids. The computer program uses the calculated change in ray error coordinates with the change in selected grid control points and weights of each of the NURBS surfaces and the change in geometry to calculate the overall changes to optimize the resulting ray error coordinates from each field point source on the image plane with respect to the corresponding image centroid of the field point on the image plane.

In the computer program, the grid control points may be automatically adjusted until the spot sizes on the image plane meet a set requirement and/or until an improvement in spot size is below a predetermined value. The number of field point sources may be determined by iteratively increasing the number of field point sources during ray tracing until the spot size from adjacent field point sources on the image plane of the imaging system varies by less than a predetermined value. The number of rays for each field point source may be determined by iteratively increasing the number of rays for each field point source during ray tracing until a predetermined number of rays intersect each NURBS rectangular grid sub-area.

Also featured is a computer program stored on a computer readable medium and including logic configured to optimize the number and location of field point sources to be used in ray tracing of a NURBS modeled imaging system surfaces by iteratively increasing the number of field point sources during ray tracing until the spot size from adjacent field points sources on the image plane of the imaging system varies by less than a predetermined value. The logic further includes a routine which optimizes the number of rays for each field point source to be used in ray tracing of the NURBS modeled imaging system surfaces by iteratively increasing the number of rays for each field point source during ray tracing until a predetermined number of rays intersect each NURBS rectangular grid sub-area. The determined number and location of field point sources and the determined number of rays from each field point source are used in ray tracing the modeled NURBS surfaces of the imaging system wherein the grid control points of each NURBS surface are optimally adjusted to minimize the spot sizes of the resulting ray trace intersections on the image plane until the spot sizes on the image plane meet a set requirement and/or until improvement in spot size is below a predetermined value to optimize the modeled NURBS surfaces of the imaging system.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
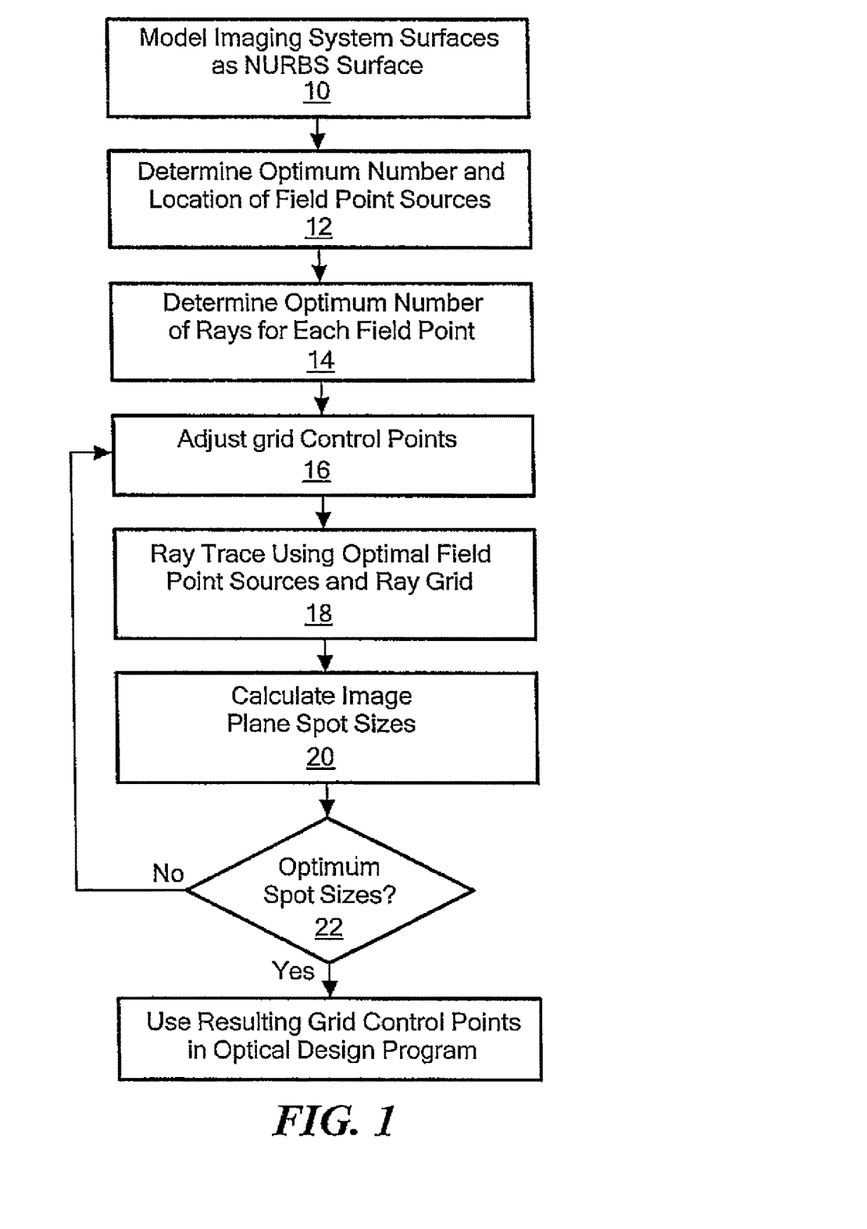
FIG. 1 is a flow chart depicting the primary steps associated with a new method of optimizing NURBS surfaces for an imaging system in accordance with the invention and also depicting the primary functions carried out by the one or more computer implemented algorithms in accordance with the invention.

In some examples, the method depicted in FIG. 1, carried out by a computer, may result in an imaging system exhibiting six times higher spatial resolution than when polynomial based solutions or aspheric surfaces are used. The conventional surfaces of a desired imaging system are converted to NURBS surfaces using mathematical techniques, step 10, FIG. 1. Grid control points, weights and knot vectors are used to model the geometry of each or select NURBS surfaces. The imaging system may be a telescope or the like. The NURBS surfaces may be reflective, refractive, or diffractive, mirrors, lens, diffraction gratings, and the like. The NURBS surfaces may form an imaging system together with other conventional polynomial surfaces such as spheres, conics, aspherics and Zernike surfaces. The other surfaces shapes may be optimized at the same time as the NURBS surface shapes are optimized to produce the best image quality.

Each NURBS surface may be a reflecting surface such as a mirror or a refractive surface such as one of the surfaces on a lens or prism, or a diffractive surface such as a grating or holographic element. In addition the NURBS surface may have any combination of the above said reflective, refractive, or diffractive optical properties.

In addition to the NURBS surfaces in the optical system, some optical surfaces may be spherical, or conical, or aspheric or anamorphic aspheric polynomial expansions. The respective coefficients of the said optical surfaces may be optimized in conjunction with the NURBS surfaces' optimization in the optical system.

Figure 2:
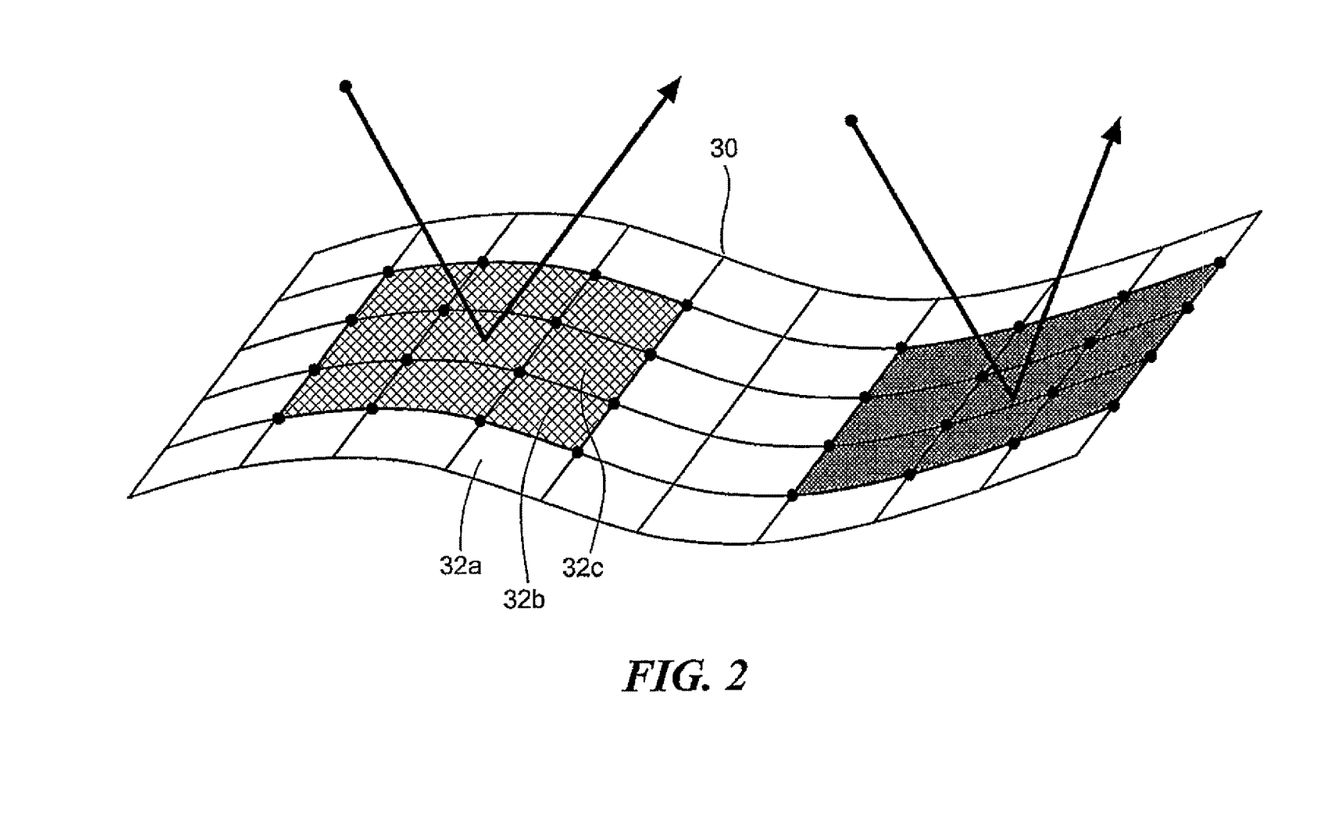
FIG. 2 is a depiction of a modeled NURBS surface.
Figure 3:
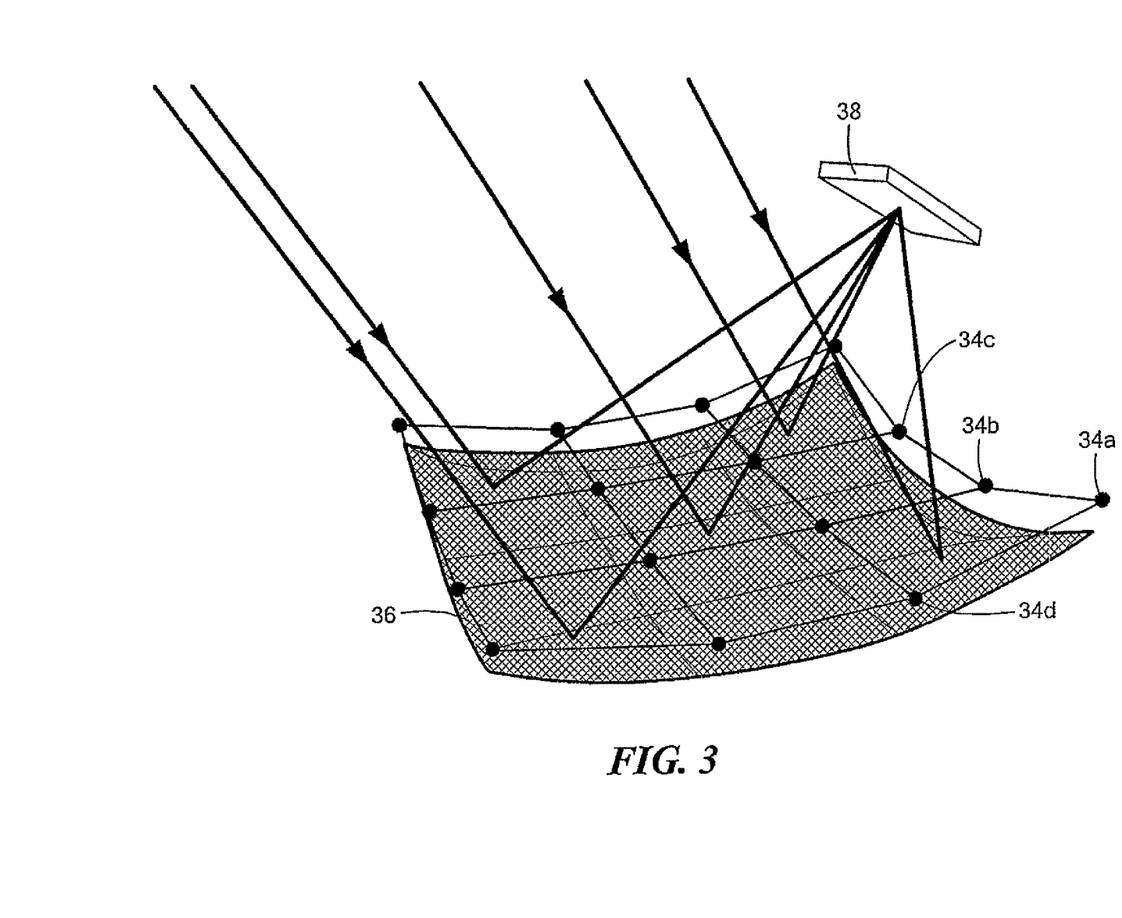
FIG. 3 is a depiction of a NURBS surface subject to ray tracing.

FIG. 2 shows a modeled NURBS surface 30 with rectangular grid sub-areas 32a, 32b, 32c, and the like. FIG. 3 shows a NURBS third degree surface 36 with control points 34a, 34b, 34c, 34d and the like. Ray tracing techniques are used to ray trace surface 36 onto image plane 38 of the imaging system.

Figure 4:
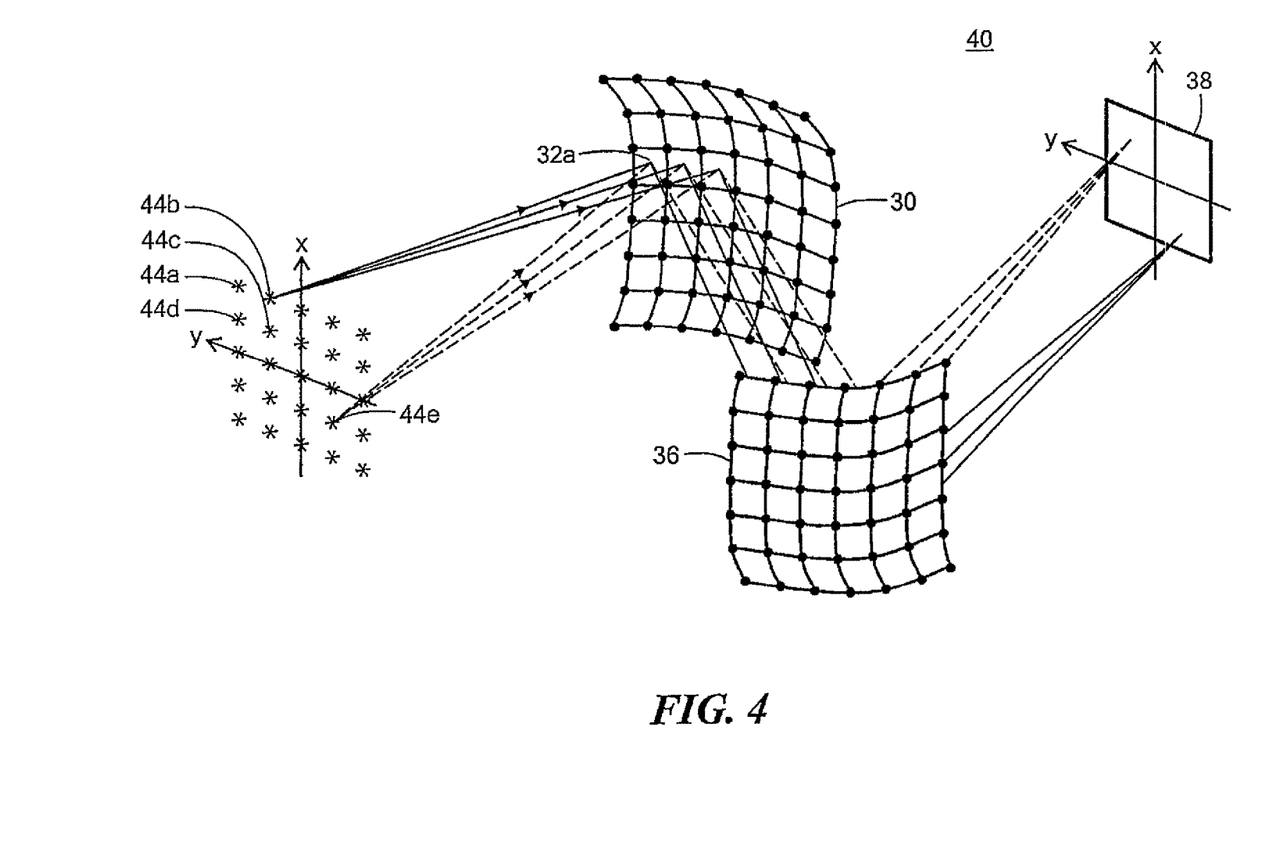
FIG. 4 is a schematic view showing a number of field source points and a number of rays emitted from selected field source points and ultimately delivered to the imaging plane of a imaging system which, in this particular example, includes two modeled NURBS reflecting surfaces.

In FIG. 4, both modeled NURBS surfaces 30 and 36 are part of an imaging system 40 having image plane 38. In this specific example, NURBS surfaces 30 and 36 are mirrors.

The rays used in ray tracing all originate from field point sources. In step 12, FIG. 1, the number and location of the field point sources is determined. FIG. 4, for example, shows a 5×5 grid of field point sources 44 each modeled to exist at certain coordinates with respect to each other and with respect to NURBS surfaces 32 and 36. Preferably, as discussed below, the optimum number of field point sources is determined for each imaging system under analysis using an iterative algorithm. In step 14, FIG. 1, the optimum number of rays from each field point source to be used in ray tracing the imaging system is determined by another iterative algorithm. FIG. 4, for example, shows three rays at 46 from field point source 44b and three rays from field point source 44e. As discussed further below, it is preferred that the number of rays from each field point source be best determined for each imaging system under analysis by employing an iterative algorithm that ensures at least a predetermined number of rays intersect each rectangular grid sub-area of each NURBS surface. FIG. 4, for example, shows rectangular grid sub-area 32a of NURBS surface 30 intersected by two rays, one from field point source 44b and one from field point source 44e. Testing and evaluation has resulted in an algorithm that iteratively increases the number of rays until at least a predetermined number (e.g., two) of rays intersect each rectangular grid sub-area of each NURBS surface from each field source. The predetermined number, however, could be different and different field point sources could be assigned a different number of rays.

For computational efficiency, it is preferred that the number of field point sources chosen and the number of rays from each field point source not be any larger than necessary for a given imaging system to be modeled. But, too few field point sources and/or too few rays used in ray tracing may adversely affect the optimization algorithm and the accuracy of the spatial resolution modeling.

Next, the grid control points (and weights) of the NURBS surfaces are iteratively adjusted, step 16, FIG. 1 while ray tracing, step 18 the NURBS surfaces of the modeled imaging system using the chosen field point sources (step 12) and ray grid (step 14). Small numerical increments are made to selected grid points and weights of each of the NURBS surfaces and the geometry and the resulting changes of the ray coordinates with respect to the image centroids are recorded.

From the change of the ray error coordinates with each individual grid point and weight change, the optimization algorithm determines the best change in all the grid control points (and weights) together which result in the physical effect of the rays moving towards the field point image centroid on the image plane 38, FIG. 4. When that occurs and the resulting spot sizes calculated on the image plane, step 20, FIG. 1 meet a set requirement (e.g., less than 0.06 mm) and/or improvement in spot size from one optimization cycle adjustment to the next is below some predetermined value (e.g., a 5% improvement), step 22, FIG. 1, then the iterative algorithm terminates and the resulting optimum grid control points are stored and/or imported into an optical design or computer aided design program in order to further design, display, model and/or fabricate the imaging system and its optical components.

Figure 5:
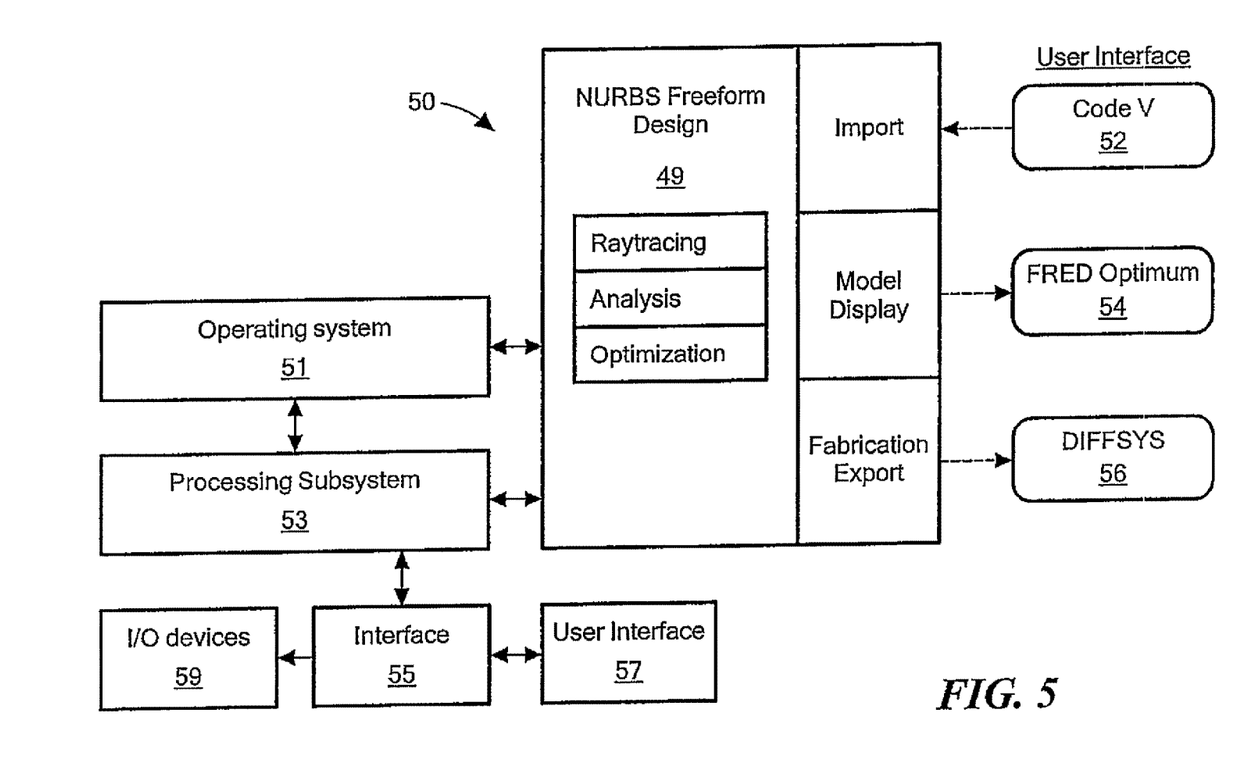
FIG. 5 is block diagrams of a computer program configured to optimize NURBS surfaces of an imaging system and how the program, operating on a computer, interfaces with different optical design and computer aided design and control programs.
Figure 8:
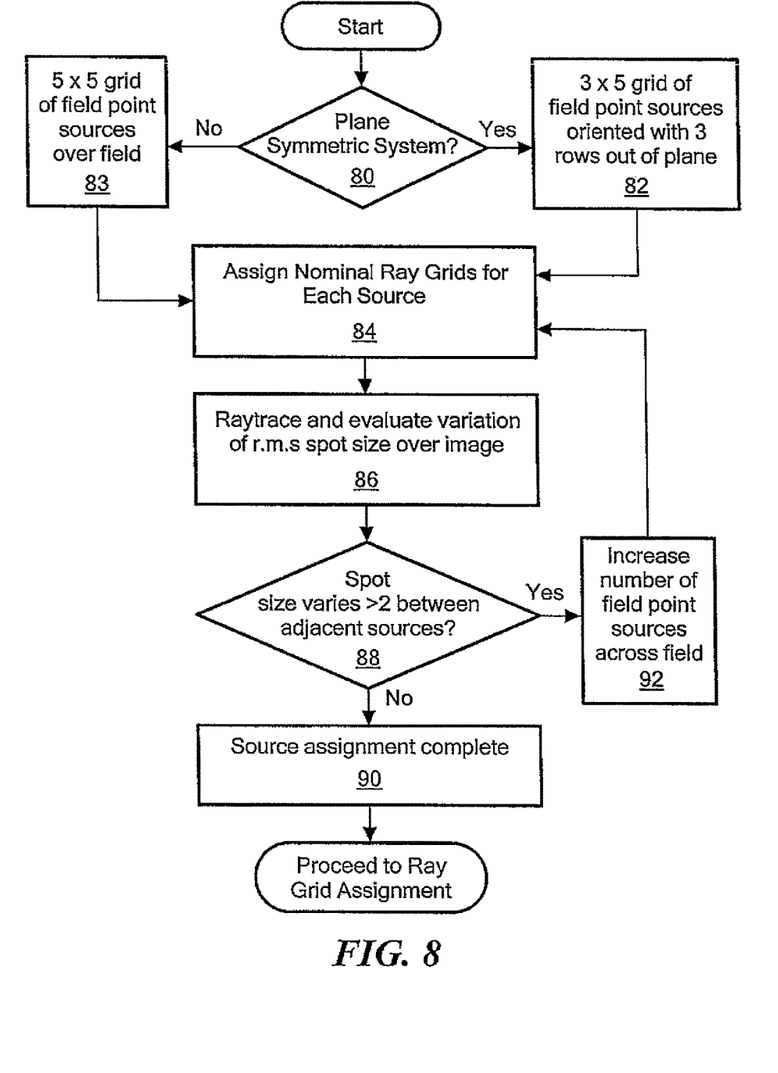
FIG. 8 is a flow chart depicting the primary steps associated with a preferred algorithm configured to determine the number and location of field point sources to be used in ray tracing of the NURBS modeled surfaces of an imaging system.
Figure 9:
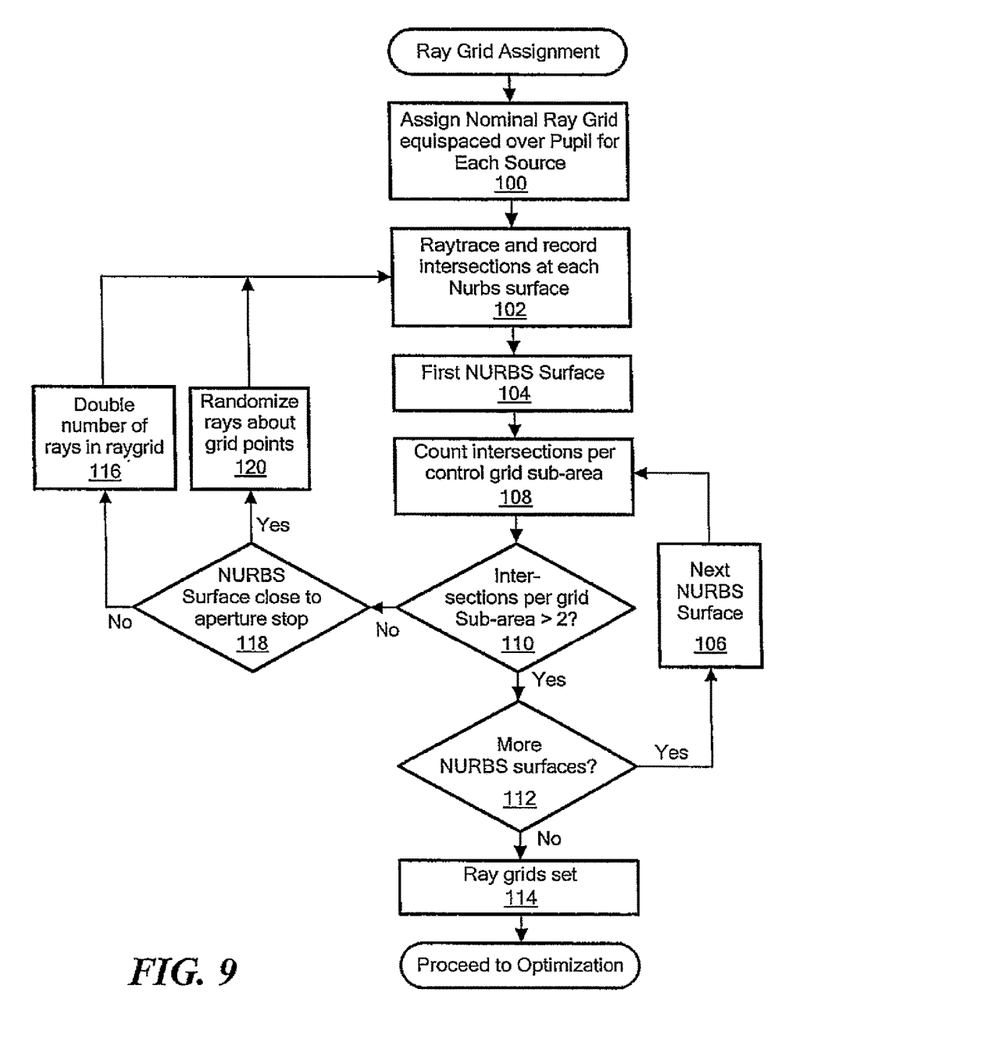
FIG. 9 is a flow chart depicting the primary steps associated with a preferred algorithm for determining the number of rays for each field point source.
Figure 10A:
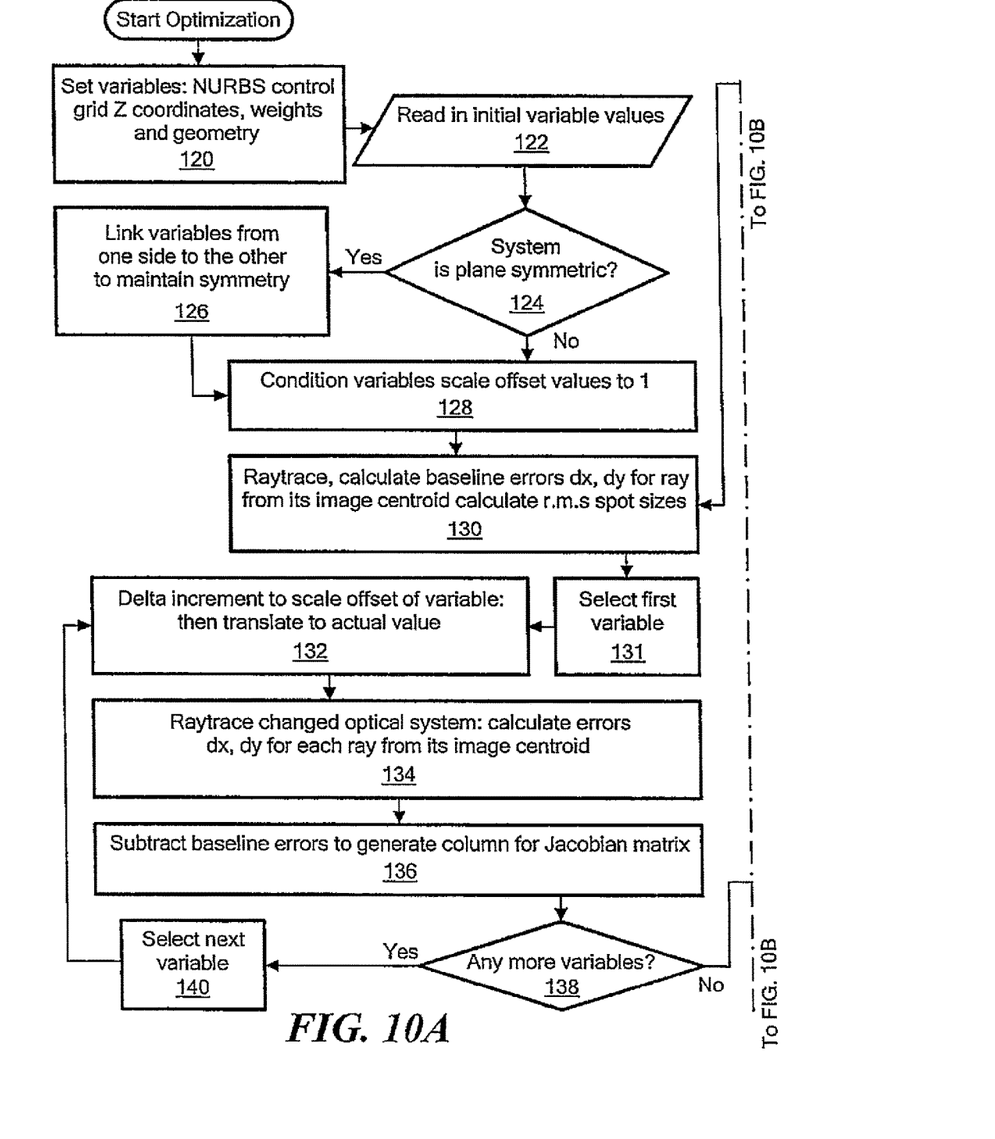
FIGS. 10A-10B are flow charts depicting the primary steps associated with a preferred algorithm for optimizing the NURBS surfaces using the output of the algorithms depicted in FIGS. 8 and 9.
Figure 10B:
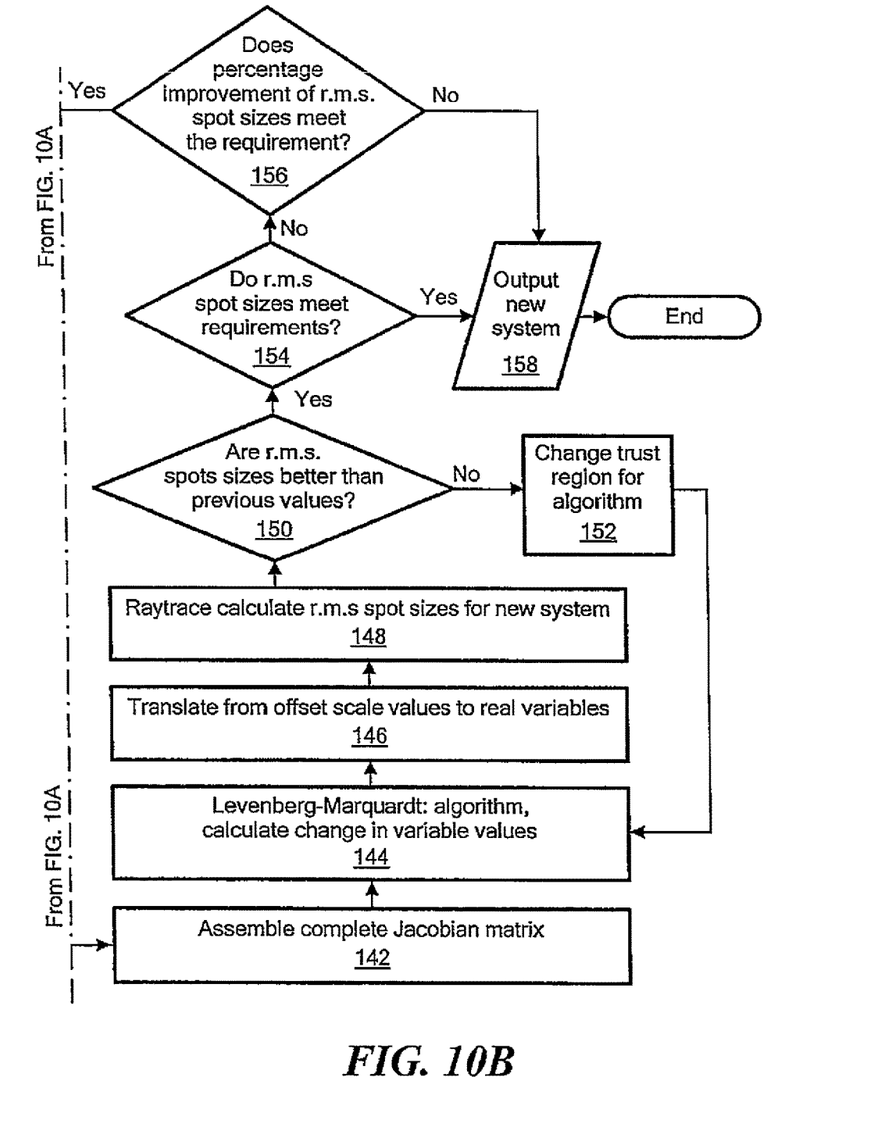

A computer program 50, FIG. 5 includes the ray tracing, analysis, and optimization routines implementing the algorithm of FIG. 1. More specific depictions of preferred algorithms for the program are shown in FIGS. 8-10. The program may import a starting design with conventional optical surfaces from optical design program 52 (e.g., the Code V program from Synopsys) and the optimized NURBS surfaces may be exported to other optical design programs 54 and/or computer aided design programs and machining control programs 56 (e.g. Diffsys from Precitech) as shown. A computing system such as a server, desktop, or distributed multiprocessor system, or laptop computer, that can be used in the design processes described above. In particular, the computing system can provide the computational power that may be needed or desirable to perform the various mathematical functions described herein. Although a single computer is depicted, it is to be understood that the functionality provided by that computer may be provided by two or more such computers, for example, coupled together in a network environment.

The preferred computing system comprises a processing subsystem 53, memory (i.e., a computer-readable medium) storing the computer algorithms shown at 49, a user interface 57 and at least one I/O device 59, each of which may be connected to a local interface 55.

The processing subsystem 53 can includes a central processing unit (CPU) or a semiconductor-based microprocessor. The memory includes any one of or a combination of volatile memory elements (e.g., RAM) and nonvolatile memory elements (e.g., hard disc, ROM, flash memory, etc.). The user interface 57 comprises the components with which a user, such as the optical designer, interacts with the computing system, such as a keyboard, mouse, and a display. The one or more I/O devices 59 are adapted to facilitate communications with other devices and may include one or more communication components such as a modulator/demodulator (e.g., modem), wireless (e.g., radio frequency (RF)) transceiver, network card, etc.

The memory comprises various code including at least an operating system 51 and the optimization code 49. The operating system 51 controls the execution of other programs and provides scheduling, input-output control, file and data management, memory management, and communication control and related services.

Various code (i.e., logic) is described herein. Such code can be stored on any computer-readable medium for use by or in connection with a computer-related system or method. A computer-readable medium may be an electronic, magnetic, optical, or other physical device or means that contains or stores code, such as a computer program, for use by or in connection with a computer-related system or method. The code can be embodied in a computer-readable medium for use by or in connection with an instruction execution system, apparatus, or device, such as a computer-based system, processor-containing system, or other system that can fetch the instructions from the instruction execution system, apparatus, or device and execute the instructions.

Figure 6A:
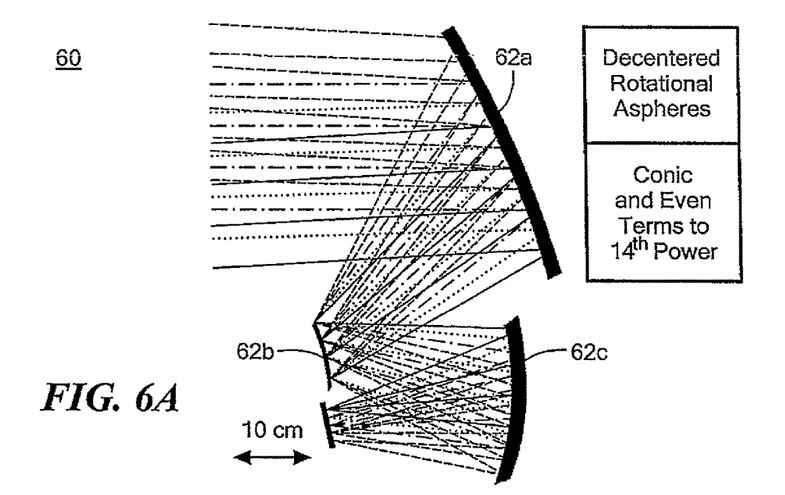
FIG. 6A is a representation of an imaging system model using conventional aspheric surfaces.
Figure 6B:
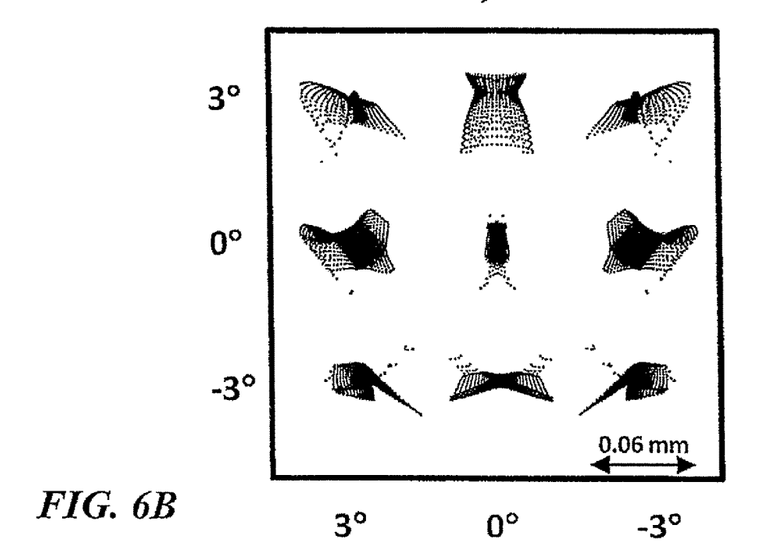
FIG. 6B is a depiction of the spatial resolution resulting from the modeled imaging system of FIG. 6A.

A telescope imaging system 60, FIG. 6A with primary mirror 62a, secondary mirror 62b, and tertiary mirror 62c was designed using conventional decentered rotational aspheric surfaces resulting in the spot sizes shown in FIG. 6B. When the new computer program employing the algorithm of FIG. 1 was used to optimize NURBS surfaces representing mirrors 62a, 62b, and 62c as shown in FIG. 7A, the resulting spatial resolution as shown in FIG. 7B was six times higher than for the conventional aspheric system FIG. 6B.

Accordingly, the invention features a method and computer program stored on a computer readable medium configured to carry out the steps of the algorithm shown in FIG. 1 to achieve higher resolution in modeled imaging systems. The computer program may be written in C++ or other computer languages and the resulting instructions may be executed on a computer such as a laptop, desktop computer, or distributed multiprocessing system for NURBS systems with numerous control points.

Figure 7A:
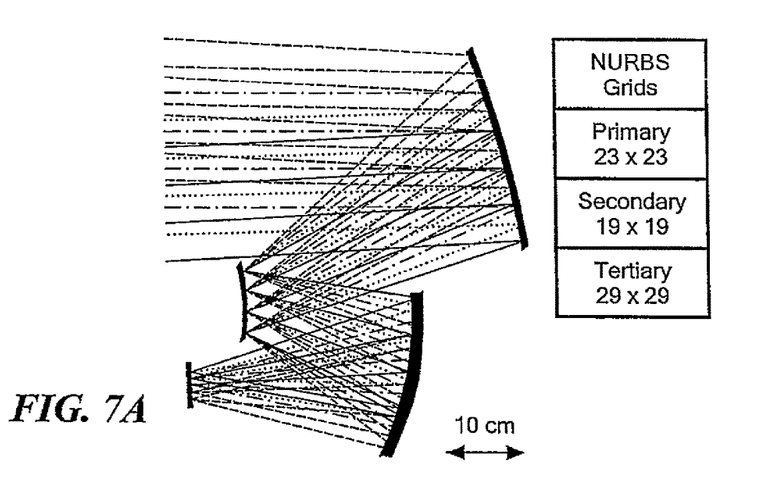
FIG. 7A is a depiction of the same imaging system now modeled using the methodology and computer code associated with the invention.
Figure 7B:
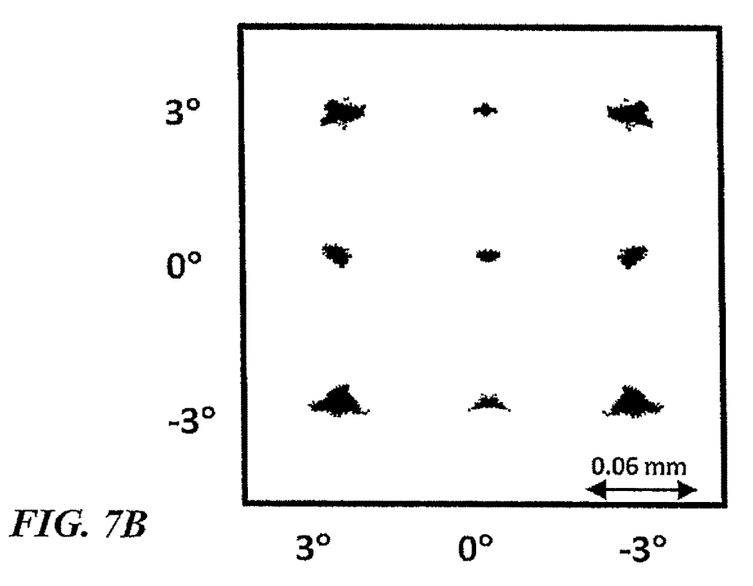
FIG. 7B is a view showing a much higher spatial resolution for the optimized NURBS surfaces depicted in FIG. 7A.

FIGS. 8-10 depict one design of a version of the computer code logic developed and tested to produce the results disclosed above with respect to FIG. 7.

In the computer algorithm of FIG. 8, the optimum number and location of field point sources is determined. If the imaging system is plane symmetric as shown at step 80, then a 3×5 grid of field point sources is chosen, oriented in three rows over half of the field. If the system is not plane symmetric as shown at step 80, then a 5×5 grid of field point sources over the full field is chosen, step 83. Next, as shown in step 84, a nominal ray grid for each field point source is assigned as shown at step 84, a typical starting grid would be 10×10 rays for each field source, distributed uniformly to fill a rectangle or circle, matching the entrance pupil shape. In step 86, the imaging system is ray traced to evaluate the variation of rms spot size on the image plane of the system. In this specific example, if the spot size varies by less than two between adjacent field point sources as shown in step 88, then the resulting field point grid and resulting ray grid for each field point source is used and the source assignment is complete as shown as step 90. If, in any iteration, however, the spot size varies by greater than 2 between adjacent field point sources, then the number of field point sources is increased as shown at step 92 iteratively as shown for steps 92, 84, 86, and 88 until the spot size between adjacent field point sources is below some preset number (such as 2) shown in step 88.

In the computer algorithm of FIG. 9, the optimum number of rays from each field point source is determined. The field point sources were preferably optimized per the algorithm of FIG. 8. As shown in step 100, FIG. 9, a nominal ray grid is assigned equally spaced over the entrance pupil for each field point source. A 10×10 grid may be used initially. In step 102, the imaging system is again ray traced and the ray intersections with each NURBS surface is recorded. For each NURBS surface as shown at steps 104 and 108, the intersections per each rectangular grid sub-area are counted. If there are at least a predetermined number (e.g., 2) of ray intersections per NURBS rectangular grid sub-area as shown in step 110, and if all NURBS surfaces have been so analyzed as shown at steps 112 and 106 then the ray grid is set as shown at step 114. If there not at least two ray intersections per rectangular grid sub-area of each NURBS surface as shown in step 110, however, then the number of rays is increased as shown as step 116, doubling the number of rays and again further iterations are conducted using ray tracing and counting the intersections per grid sub-area until the condition of step 110 is met. Preferably, in one special case, if NURBS surface is close to an aperture stop as shown at step 118 (specified by design), then the rays are randomized about the grid points, step 120.

Next, the NURBS surfaces themselves are optimized according to the algorithm of FIG. 10. Here, in ray tracing, the number of field point sources determined via the algorithm of FIG. 8 and the ray grid sets determined via the algorithm of FIG. 9 are used. In step 120, various variables are set such as the NURBS control grid Z coordinates, weights, and geometry (spatial relationships between the field point sources, the NURBS surfaces, and the object and image planes) and all initial variable values are read in step 122 such as the grid control points for the NURBS surfaces. Again, if the imaging system is plane symmetric as shown at 124 then the NURBS surface variables are linked from one side to the other to maintain symmetry as shown at step 126. In step 128, the variables are conditioned and then scaled so that the offset values are set to one. In step 130, ray tracing is used to calculate base line errors dx, dy for each ray from its image centroid, and to calculate the rms spot sizes on the imaging plane.

The Jacobian matrix used in the Levenberg-Marquardt algorithm is calculated in steps 131, 132, 134, 136, 138, 140, 142. The first variable is selected in step 131, incremented in scaled space, then translated into a real value step 132, then raytraced to calculate the displacement errors dx, dy for each ray from its respective field point centroid in step 134. Then in step 136 the baseline ray errors from step 130 are subtracted from the ray errors in step 134 to calculate the changes in the ray errors corresponding to the variable change (where the variable can be a control point position, control point weight or geometry parameter, such as surface position.) In step 138 a check is made for next remaining variables, which if available is selected in step 140 and then next column for the Jacobian matrix is generated through steps 132, 134, 136.

In step 142 the Jacobian matrix is assembled from the columns generated by step 136. This matrix is then supplied to the Levenberg-Marquardt optimization algorithm (also known as damped least-squares) in step 144, and the algorithm calculates the optimal changes to variables to best improve the r.m.s. spot size. The system may be raytraced a number of times during an optimization cycle to establish the trust region of validity for this change, this takes place in step 146, changing from scaled variable values to real variable values, step 148, raytracing algorithm variable values to find the r.m.s. spot sizes, step 150, checking to see if the spot sizes are reduced from the previous baseline values, from step 130, and changing the trust region if the spot sizes are worse in step 152.

In step 154 the r.m.s. spot sizes are compared with the size requirements, if they meet them then the new system is output in step 158 and saved, before the program ends. If the spot sizes are above their required sizes, then in step 156 the percentage change from the previous baseline in step 130 is calculated and evaluated to see if the spot size reduction is above the percentage change exit criteria, in which case another optimization cycle starts by transferring the new set of variable parameters to step 130. If spot size reduction is below the required percentage change, then the new system is output in step 158 and the program ended. Functionally similar algorithms may also be used.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant cannot be expected to describe certain insubstantial substitutes for any claim element amended.

Other embodiments will occur to those skilled in the art and are within the following claims.

What is claimed is:

1. A method of optimizing NURBS surfaces for an imaging system, the method carried out by at least one computer and comprising:

modeling surfaces of the imaging system as NURBS surfaces;

determining the number and location of field point sources to be used in ray tracing of the NURBS modeled imaging system surfaces by automatically iteratively increasing the number of field point sources during ray tracing until the spot size from adjacent field points sources on the image plane of the imaging system varies by less than a predetermined value;

determining the number of rays for each field point source to be used in ray tracing of the NURBS modeled imaging system surfaces by automatically iteratively increasing the number of rays for each field point source during ray tracing until a predetermined number of rays intersect each NURBS grid sub-area; and optimizing the modeled NURBS surfaces of the imaging system by:

ray tracing the modeled NURBS surfaces of the imaging system using the determined number and location of field point sources and the determined number of rays from each field point source, and optimizing by iteratively adjusting the grid control points of each NURBS surface, and the spatial relationships of the surfaces and object and image planes, until spot sizes on the image plane meet a set requirement and/or until improvement in spot size is below a predetermined value.

2. The method of claim 1 further including using the resulting grid control points for each NURBS surface and the position of each NURBS surface of the imaging system to design, display, model, and/or fabricate optical surfaces for the imaging system.

3. A non-transitory computer readable medium storing a computer program which, when executed by a computer, performs the following steps:

model each surface of the imaging system as a NURBS surface;

determine the number and location of field point sources to be used in ray tracing of the NURBS modeled imaging system surfaces by iteratively increasing the number of field point sources during ray tracing until the spot size from adjacent field points sources on the image plane of the imaging system varies by less than a predetermined value;

determine the number of rays for each field point source to be used in ray tracing of the NURBS modeled imaging system surfaces by iteratively increasing the number of rays for each field point source during ray tracing until a predetermined number of rays intersect each NURBS surface rectangular grid sub-area;

use the determined number and location of field point sources and the determined number of rays from each field point source in ray tracing the modeled NURBS surfaces of the imaging system; and adjust the grid control points of each NURBS surface and the spatial relationship between the surfaces to minimize the spot sizes of the resulting ray traces on the image plane until the spot sizes on the image plane meet a set requirement and/or until improvement in spot size is below a predetermined value to optimize the modeled NURBS surfaces of the imaging system.

4. A computerized method of optimizing NURBS surfaces for an imaging system, the method carried out by at least one computer and comprising:

modeling select optical surfaces of the imaging system each as a NURBS surface;

determining the number and location of field point sources to be used in ray tracing of the NURBS modeled imaging system surfaces including iteratively increasing the number of field point sources during ray tracing until the spot size from adjacent field points sources on an image plane of the imaging system varies by less than a predetermined value;

determining the number of rays for each field point source to be used in ray tracing of the NURBS modeled imaging system surfaces; and optimizing the modeled NURBS surfaces of the imaging system by:

ray tracing the modeled NURBS surfaces of the imaging system using the determined number and location of field point sources and the determined number of rays from each field point source, adjusting the grid control points of each NURBS surface to minimize the spot sizes of the resulting ray traces on the image plane, and outputting the resulting grid control points for each NURBS surface and the position of each NURBS surface of the imaging system.

5. A non-transitory computer readable medium storing a computer program which, when executed by a computer, performs the following steps:

model each surface of the imaging system as a NURBS surface;

determine the number and location of field point sources to be used in ray tracing of the NURBS modeled imaging system surfaces by iteratively increasing the number of field point sources during ray tracing until the spot size from adjacent field points sources on an image plane of the imaging system varies by less than a predetermined value;

determine the number of rays for each field point source to be used in ray tracing of the NURBS modeled imaging system surfaces;

use the determined number and location of field point sources and the determined number of rays from each field point source in ray tracing the modeled NURBS surfaces of the imaging system;

adjust the grid control points of each NURBS surface, and the spatial relationships of the surfaces, to minimize the spot sizes of the resulting ray traces on the image plane to optimize the modeled NURBS surfaces of the imaging system; and output the resulting grid control points for each NURBS surface and the position of each NURBS surface of the imaging system.

6. A computerized method of optimizing NURBS surfaces for an imaging system, the method carried out by at least one computer and comprising:

modeling select optical surfaces of the imaging system each as a NURBS surface;

determining the number and location of field point sources to be used in ray tracing of the NURBS modeled imaging system surfaces;

determining the number of rays for each field point source to be used in ray tracing of the NURBS modeled imaging system surfaces including iteratively increasing the number of rays for each field point source during ray tracing until a predetermined number of rays intersect each NURBS grid sub-area; and optimizing the modeled NURBS surfaces of the imaging system by:
 ray tracing the modeled NURBS surfaces of the imaging system using the determined number and location of field point sources and the determined number of rays from each field point source,
 adjusting the grid control points of each NURBS surface to minimize the spot sizes of the resulting ray traces on the image plane, and
 outputting the resulting grid control points for each NURBS surface and the position of each NURBS surface of the imaging system.

7. A non-transitory computer readable medium storing a computer program which, when executed by a computer, performs the following steps:

model each surface of the imaging system as a NURBS surface;

determine the number and location of field point sources to be used in ray tracing of the NURBS modeled imaging system surfaces;

determine the number of rays for each field point source to be used in ray tracing of the NURBS modeled imaging system surfaces by iteratively increasing the number of rays for each field point source during ray tracing until a predetermined number of rays intersect each NURBS rectangular grid sub-area;

use the determined number and location of field point sources and the determined number of rays from each field point source in ray tracing the modeled NURBS surfaces of the imaging system;

adjust the grid control points of each NURBS surface, and the spatial relationships of the surfaces, to minimize the spot sizes of the resulting ray traces on the image plane to optimize the modeled NURBS surfaces of the imaging system; and output the resulting grid control points for each NURBS surface and the position of each NURBS surface of the imaging system.

* * * * *